(12) United States Patent
Abbott et al.

(10) Patent No.: US 8,294,330 B1
(45) Date of Patent: Oct. 23, 2012

(54) HIGH COUPLING, LOW LOSS SAW FILTER AND ASSOCIATED METHOD

(75) Inventors: Benjamin P. Abbott, Longwood, FL (US); Natalya F. Naumenko, Moscow (RU)

(73) Assignee: TriQuint Semiconductor, Inc., Hillsboro, OR (US)

( * ) Notice: Subject to any disclaimer, the term of this patent is extended or adjusted under 35 U.S.C. 154(b) by 634 days.

(21) Appl. No.: 12/414,706

(22) Filed: Mar. 31, 2009

(51) Int. Cl.
 *H03H 9/25* (2006.01)
(52) U.S. Cl. ............ 310/313 A; 310/313 B; 310/313 R; 310/365
(58) Field of Classification Search .............. 310/313 A, 310/313 B, 313 R, 313 D, 313 C, 360, 363–366; 333/193–196; *H01L 41/09, 41/08; H03H 9/64*
See application file for complete search history.

(56) References Cited

U.S. PATENT DOCUMENTS

| | | | |
|---|---|---|---|
| 5,854,527 A * | 12/1998 | Shimizu et al. ........... | 310/313 A |
| 6,661,313 B2 * | 12/2003 | Naumenko et al. ........... | 333/193 |
| 7,339,304 B2 | 3/2008 | Kadota et al. | |
| 7,345,400 B2 | 3/2008 | Nakao et al. | |
| 7,355,319 B2 | 4/2008 | Kando | |
| 7,411,334 B2 | 8/2008 | Nishiyama et al. | |
| 2007/0284965 A1 | 12/2007 | Kadota et al. | |
| 2008/0160178 A1 | 7/2008 | Nishiyama et al. | |

OTHER PUBLICATIONS

Hashimoto, Ken-Ya et al., "Ultra-Wideband Surface Acoustic Wave Devices Using Cu-Grating/Rotated-YX-LiNbO3 Substrate Structure," Japanese Journal of Applied Physics, vol. 43, No. 5B, pp. 3063-3066, 2004.
Naumenko et al., "Analysis of Highly Piezoelectric Non-Leaky SAW Propagating in Rotated Y-Cuts of Lithium Niobate with Thick Metal Films or Gratings," Proc. 2006 IEEE Ultrasonic Symposium, Vancouver, Canada, Oct. 4-6, 2006.
Takayama, et al., "Advacement of SAW Duplexer by Using SIO2," Third International Symposium on Acoustic Wave Devices for Future Mobile Communication Systems, pp. 139-144, 2007.
Kadota et al., "Small Surface Acoustic Wave Duplexer for Wide-Band Code-Division Multiple Access Full-Band System Having Good Temperature Characteristics," Japanese Journal of Applied Physics, vol. 46, No. 7B, pp. 4714-4717, Jul. 26, 2007.
Nakamura et al., "Minature Surface Acoustic Wave Duplexer Using SiO2/Al/LiNbO3 Structure for Wide-Band Code Division Multiple-Access System," vol. 47, No. 5, pp. 4052-4055, 2008.

* cited by examiner

*Primary Examiner* — Thomas Dougherty
*Assistant Examiner* — Karen B Addison
(74) *Attorney, Agent, or Firm* — Schwabe Williamson & Wyatt

(57) ABSTRACT

A surface acoustic wave device with improved temperature characteristics includes a piezoelectric substrate of a single crystal of symmetry 3m, providing propagation of a SAW having an electromechanical coupling factor exceeding 5%, an electrode pattern on a substrate surface forming a resonator, and a SiOx overlay covering the electrode pattern. An optimized thickness of the electrodes combined with an SiOx overlay provide improved performance in RF applications with improved temperature characteristics. To suppress spurious responses the SiOx thickness is varied depending upon the relative thickness and period of the electrodes. The electrode pattern forms resonators with the silicon oxide thickness over the electrodes inversely related to the period of the electrodes of the resonators.

19 Claims, 17 Drawing Sheets

TCF as function of rotation angle of YX-cut LN, with Cu electrode thickness h/p=0.1 and different SiO2 overlay thickness $h_{SiO2}/p$=0, 0.3 and 0.6
(flat top surface)

| Rotation angle | $h_{SiO2}/p$=0.6 | | $h_{SiO2}/p$=0.3 | | $h_{SiO2}/p$=0 | |
|---|---|---|---|---|---|---|
| | TCF-OC | TCF-SC | TCF-OC | TCF-SC | TCF-OC | TCF-SC |
| 50 | -17.995 | -19.412 | -40.923 | -2.46 | -71.868 | -47.529 |
| 55 | -17.693 | -15.309 | -41.268 | -10.205 | -72.027 | -48.717 |
| 60 | -17.313 | -10.606 | -41.333 | -16.267 | -72.086 | -51.108 |
| 65 | -16.854 | -6.264 | -41.087 | -20.553 | -71.893 | -53.514 |
| 70 | -16.328 | -3.060 | -40.529 | -23.399 | -71.388 | -55.354 |

HIGH COUPLING, LOW LOSS SAW FILTER AND ASSOCIATED METHOD

FIELD OF INVENTION

The present invention generally relates to surface acoustic wave (SAW) devices and more particularly to SAW devices having simultaneously strong electromechanical coupling, low spurious responses, and an improved frequency-temperature characteristic for application in radio frequency (RF) filtering for wireless communications.

BACKGROUND OF THE INVENTION

SAW devices are successfully used in wireless communication systems as a result of their small size and low insertion loss provided by resonator-type structures, built on piezoelectric substrates with high electromechanical coupling factor. Such devices commonly utilize low-attenuated quasi-bulk leaky surface acoustic waves (LSAW) characterized by high electromechanical coupling factor. Such waves are known to exist in two piezoelectric crystals belonging to the same symmetry class 3m, lithium tantalate, LiTaO3 (LT), and lithium niobate, LiNbO3 (LN). Recently, devices fabricated using non-leaky quasi-shear horizontal waves devices have been reported. The suppression of the leakage effect results when the surface on which the acoustic wave propagates is sufficiently loaded so as to slow the wave velocity such that its value is less than that of the slow quasi-shear bulk wave propagating in the same direction. For example, 15YX LN devices employing thick copper electrodes have been reported by Hashimoto et al, and by Takayama et al. and Kadota et al, the disclosures of which are detailed later in this specification.

SUMMARY OF THE INVENTION

In view of the foregoing background, one embodiment of the invention may comprise a surface acoustic wave device including a piezoelectric substrate, a pattern of electrodes, with metal electrode, and an SiOx (silicon oxide) overcoat which provides strong electromechanical coupling factor, reduced TCF, and robust suppression of spurious modes.

Heavy electrodes ensure that leaky waves, which exists on orientations of YX LN, are sufficiently slowed that the velocity is reduced below that of the slow shear bulk wave. In such an instance the leakage nature of this LSAW mode is suppressed. The selection of the heavy electrode geometry must be accompanied by the proper selection of the thickness of the SiOx overcoat so as to ensure the Rayleigh mode's spurious response is suppressed and does not negatively impact the filter's response.

One embodiment of the present invention includes a surface acoustic wave device that may comprise a single crystal LiNbO3 piezoelectric substrate for providing a propagation of a leaky acoustic wave. The substrate desirably has an electromechanical coupling factor exceeding 5%, and an orientation defined by Euler angles (0±3°,θ,0±3°), with angle θ=90-θ', where θ' ranges from about −40° to about −20°. An electrode pattern forming at least one resonator is formed on a surface of the piezoelectric substrate from electrodes made substantially of copper, wherein a thickness of the copper electrode pattern ranges from 0.15p to 0.25p, and wherein "p" being a period of the electrodes within the electrode pattern. The device further includes a dielectric overcoat comprising a SiOx having a positive TCF and disposed between and over the electrodes. A density of the electrodes substantially exceeds a density of the dielectric overcoat. The dielectric overcoat has a thickness in the range of hox/p=0.30·(hCu−0.15)/(0.20p−0.15)+/−0.05, wherein "hox" is a thickness of the overcoat as measured above a top surface of the electrodes, and "hCu" is a thickness of the electrodes within the electrode pattern of electrodes formed primarily of copper.

One surface acoustic wave device according to the teachings of the present invention comprises a single crystal piezoelectric substrate for providing a propagation of a leaky acoustic wave, the substrate may have a electromechanical coupling factor exceeding 5%. An electrode pattern is provided on a surface of the piezoelectric substrate so as to form at least two resonators, wherein a first resonator has a silicon oxide layer of thickness hox1 and electrode period p1 and a second resonator has a silicon oxide layer of thickness hox2 and an electrode period p2, and wherein the dielectric overcoat thicknesses of the resonators are specified to be inversely related to the period of the resonator electrode. Bu way of example, a resonator with a smaller electrode period will therefore comprise a thicker dielectric overcoat.

Yet another embodiment of a surface acoustic wave device according to the teachings of the present invention may comprise a single crystal piezoelectric substrate having a surface for providing propagation of acoustic waves, first and second resonators formed on the surface of the substrate, first and second electrode patterns including a plurality of electrodes forming the first and second resonators, respectively, a first dielectric overcoat formed over the first resonator and a second dielectric overcoat formed over the second resonator, wherein the first resonator includes the first dielectric overcoat having a thickness of hox1 and an electrode period p1, wherein the second resonator includes the second dielectric overcoat having a thickness hox2 and an electrode period p2, and wherein the dielectric overcoat thickness for each of the first and second resonators is inversely related to the electrode period of the resonator, thus reducing the electrode period results in an increasing of the dielectric overcoat for maintaining performance of the device.

The present invention provides for a reduced sensitivity to variations in device geometry so as to improve ability to manufacture devices and filters constructed using a 'non-leaky' wave whose velocity of propagation is below that of the slow shear bulk wave. Yet further, the present invention provides a means for design and manufacture of devices and filters by overcoming problems typically associated with spurious modes.

BRIEF DESCRIPTION OF THE DRAWINGS

Other features and advantages of the present invention will become more apparent from the following detailed description of embodiments herein disclosed by way of example with reference to the attached drawings, in which.

DETAILED DESCRIPTION OF EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
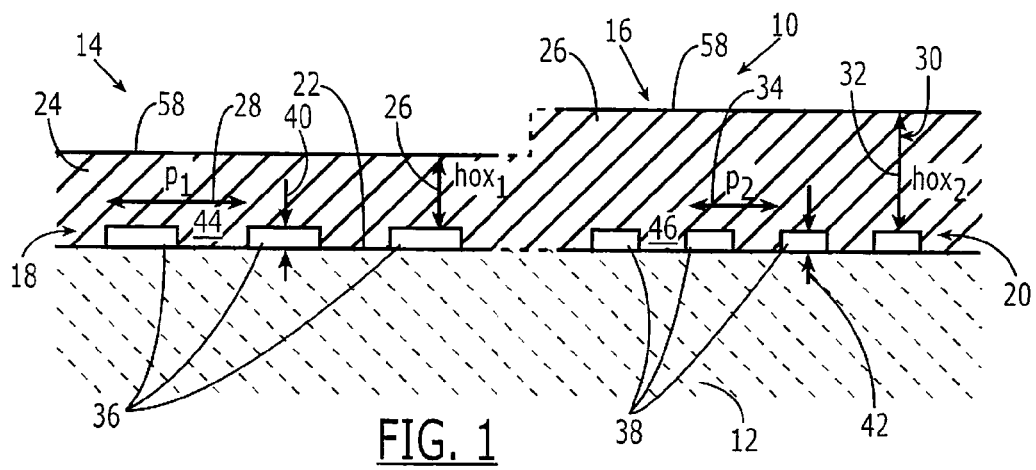
FIG. 1 is a diagrammatical cross sectional view illustrating one SAW device according to the teachings of the present invention, wherein two or more resonators and two or more electrode periods with an oxide overcoat are adjusted to specified thicknesses as required to suppress the coupling factor for spurious modes for each resonator.

With reference initially to FIG. 1, one embodiment of the present invention is herein described, by way of example, for a surface acoustic wave device (SAW) 10 comprising a single crystal piezoelectric substrate 12 for providing a propagation of a leaky acoustic wave. For the embodiment herein described by way of example, first and second resonators 14, 16 are formed by first and second electrode patterns 18, 20 on a surface 22 of the piezoelectric substrate 12. The first resonator 14 has a dielectric overcoat 24 in the form of a silicon oxide layer of thickness 26 (illustrated as hox1) and an electrode period 28 (illustrated as p1). The second resonator 16 has an overcoat 30 of silicon oxide in a layer of thickness 32 (hox2) and an electrode period 34 (p2). The dielectric overcoat thicknesses 26, 32 of the resonators 14, 16, respectively, are inversely related to the periods 28, 34 of the electrode patterns 18, 20. The thicknesses 26, 32 of the dielectric overcoats 24, 30 as measured directly above the electrodes 36, 38 within the resonators 16, 18 nominally increase as the period 28, 34 of the resonators decreases. For the embodiment and resulting performance data herein presented and described by way of example, the electrodes 36, 38 are composed substantially of copper (Cu).

With continued reference to FIG. 1, the two resonators 14, 16 have electrode periods 28, 34 and overcoat thicknesses 26, 32 satisfying the relationship (hox1/$p1$−hox2/$p2$)/(hCu/p1−hCu/p2)>5, where hCu representing the thickness 40, 42 of the copper electrodes 36, 37.

For one embodiment of the device 10 providing desirable performance as will be addressed later in this specification, the thickness of electrodes 36, 38 is in a range of about 10% to about 30% of the electrode period 28, 34. Optionally, the dielectric overcoat thickness 26, 32 may range between zero and 75% of acoustic wavelength of a surface acoustic wave excited on the surface 22 of the substrate 12. Further, the piezoelectric substrate 12 has an orientation defined by Euler angles (0±3°, θ, 0±3°), with angle θ=90°−θ' and YX rotation angle θ', wherein θ' ranges from about −40° to about −20°.

Figure 2:
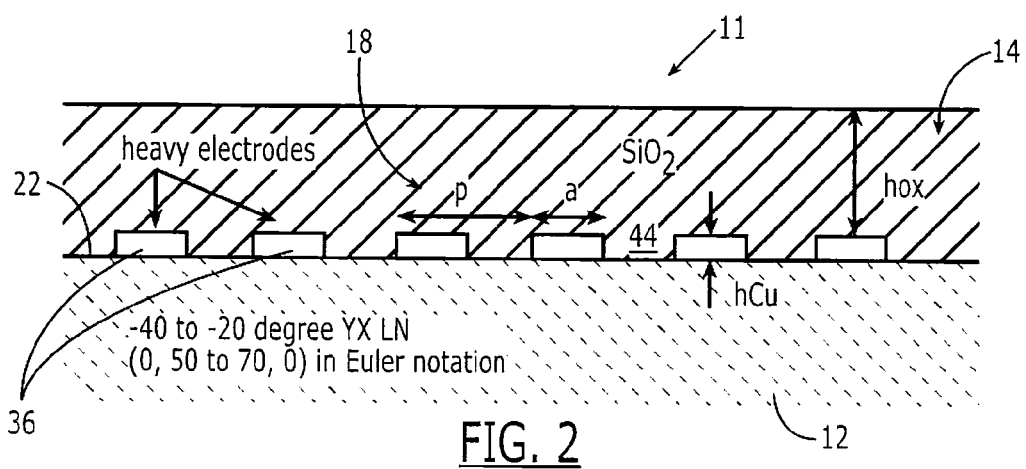
FIG. 2 Illustrates a device according to the teachings of the present invention comprising heavy electrodes with pitch (p), width (a), and thickness (hCu), "buried" in silicon dioxide having a thickness (hox, also known as $h_{ox}$) on a LN substrate with a −40 degree to −20 degree YX orientation, or in Euler notation (0, 50 to 70, 0) degrees.

With regard to the substrate 12, and as illustrated with reference to FIG. 2, one embodiment of the present invention includes a surface acoustic wave device 11 comprising a single crystal LiNbO3 piezoelectric substrate 12 for providing a propagation of a leaky acoustic wave. The substrate 12 desirably has a squared electromechanical coupling factor exceeding 5%, and an orientation defined by Euler angles (0±3°,θ,0±3°), with angle θ=90−θ', where θ' ranges from about −40° to about −20°. The electrode pattern 18 forming at least the one resonator 14 is formed on the surface 22 of the piezoelectric substrate 12 from electrodes 36 made substantially of copper, wherein the thickness 40 of the copper electrode pattern 18 ranges from 0.15p to 0.25p, and as above, "p" is the period 28 of the electrodes 40 within the electrode pattern. The device 11 further includes the dielectric overcoat 24 comprising SiOx having a positive TCF and disposed between 44 and over 46 the electrodes 38. The density of the electrodes substantially exceeds a density of the dielectric overcoat. The dielectric overcoat has a thickness in the range of hox/p=0.30*(hCu−0.15)/(0.20p−0.15)+/−0.05.

To better appreciate improvements resulting from the teachings of the present invention, reference is initially made to [Hashimoto, Asana, Omori, Yamaguichi, "Ultra-wideband surface acoustic wave devices using Cu-Grating/Rotated-YX—LiNbO3 Substrate structure", Japanese journal of applied physics, vol. 43, no. 5B, 2004, pp. 3063-3066.] and [Takayama, Nakanishi, Iwasaki, and Nakamura, "Advancement of SAW Duplexer by using SIO2," Third International Symposium on Acoustic Wave Devices for Future Mobile Communication Systems, 2007, pp 139-144.]

Kadota et al. have also reported on devices designed for cellular handsets in which a SiOx overcoat (hox/p≈0.6) is applied to a copper electrode structure (hCu/p≈0.1) on a θ'=−40 to −20 degree Y-rotated, X-propagating orientation of LN (−40YX to −20YX LN which is equivalent to 140YX to 160YX LN). The desired effect of the SiOx is to reduce the frequency drift resulting from changes in temperature. The general structure of Kadota's device includes an electrode pattern on a substrate as is well known in the art. Reference is herein made to [Kadota, Nakao, Nishiyama, Kido, Kato, Omote, Yonekura, Takada, and Kita, "Small Surface Acoustic Wave Duplexer for Wide-Band Code-Division Multiple Access Full-Band System Having Good Temperature Characteristics," Japanese Journal of Applied Physics, vol. 46, No. 7B, 2007, pp. 4714.]

Nakamura et al. have also published similar results. See [Nakamura, Nakanishi, Tsurunari, Matsunami, Iwasaki, Hashimoto, and Yamaguchi, "Minature Surface Acoustic Wave Duplexer Using SiO2/Al/LiNbO3 Structure for Wide-Band Code Division Multiple-Access System," vol. 47, No. 5, 2008, pp. 4052-4055.]

Kadota's work refers interchangeably to orientations of YX LN as well as to Euler angles. These are equivalent descriptions. For Euler angles of (0, θ, 0), the equivalent YX rotation is A'=0-90 degrees.

The performance characteristics of a conventional SAW filter depends predominately upon its electromechanically coupling factor, the attenuation of propagation, and the temperature coefficient of frequency (TCF).

In rotated YX cuts of LN, two surface modes can propagate, with different velocities and different electromechanical coupling coefficients. In a SAW device utilizing the mode with higher coupling, the mode with lower coupling produces spurious response. The performance of SAW devices depends upon the degree by which the spurious response is suppressed.

As reported by Naumenko et al., polarizations of two modes depend on rotation angle, mechanical load and electrical boundary condition and generally include three components—longitudinal (L), shear horizontal (SH) and shear vertical (SV). A contribution of SH-component or a combination of L and SV components vanishes for certain rotation angles, which means that Rayleigh SAW or SH-SAW can propagate in such selected orientations. For arbitrary rotation angle, and with increasing mass load, polarization cannot be used to distinguish between two modes and the velocities must be used for this purpose.

Reference is herein made to [N. F. Naumenko, and B. P. Abbott, "Analysis of Highly Piezoelectric Non-Leaky SAW Propagating in Rotated Y-Cuts of Lithium Niobate with Thick Metal Films or Gratings", Proc.2006 IEEE Ultrasonics Symposium, Vancouver, Canada, Oct. 4-6, 2006.]

Thus, for arbitrary rotation angle and electrode thickness it is not generally possible to distinguish between these two modes by examining their polarizations. Instead their propagation velocities may be used. Alternatively, the mode with a substantially greater coupling factor may be qualified as the "desired mode" and the weaker one as the "spurious mode".

For an unloaded surface, one of two modes propagating in rotated YX cuts of LN is always slower than the slow shear bulk wave propagating in the same orientation, independent of cut angle. The contribution of SH-component into polarization of this surface wave is sufficiently small, for any propagation angle, when the surface is unloaded. Therefore, for simplicity, this mode can be called 'Rayleigh-type' wave. In Kadota's paper referenced above, this mode is called a 'Rayleigh wave'. The velocity of the second mode lies between that of the slow shear and fast shear bulk waves, when the surface is unloaded, thus making this wave leaky. It becomes 'non-leaky', when the surface is sufficiently loaded. In Kadota's paper, this mode is called 'Love wave', though it is not SH-polarized in general. Hereafter, for the convenience of description, the high coupling 'non-leaky' wave is described as the "desired mode" and the Rayleigh-type wave as the "spurious mode".

Figure 3:
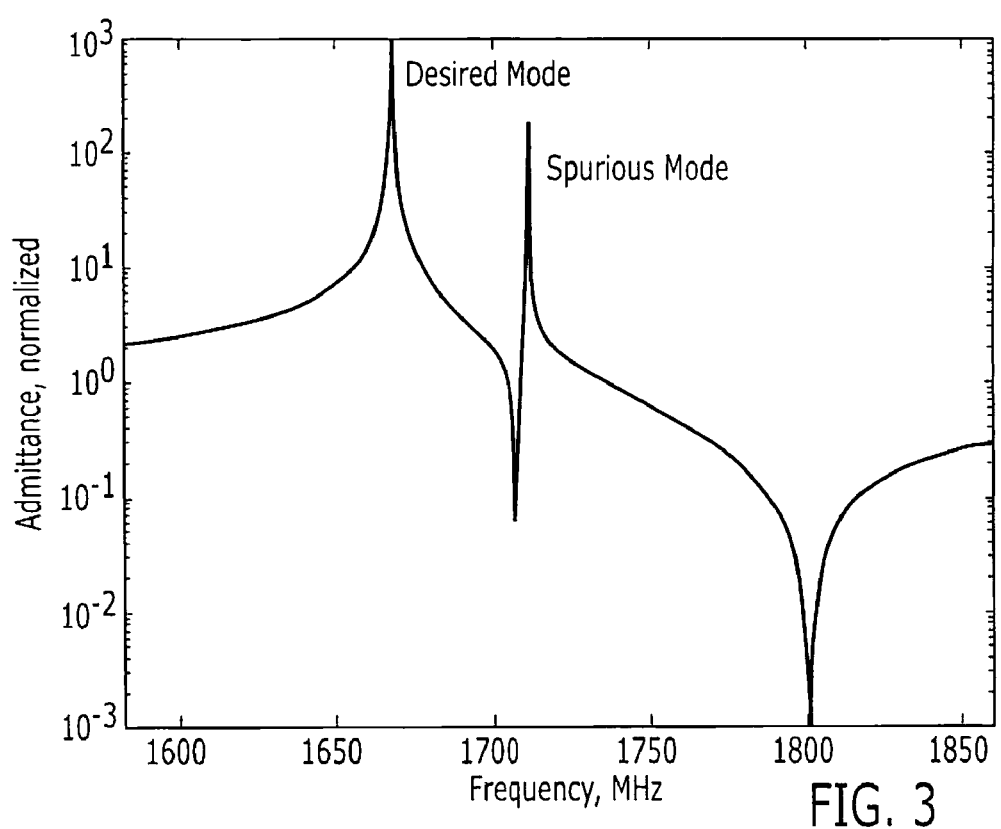
FIG. 3 Illustrates admittance frequency response of a one port resonator including the response for both desired and spurious modes.
Figure 4:
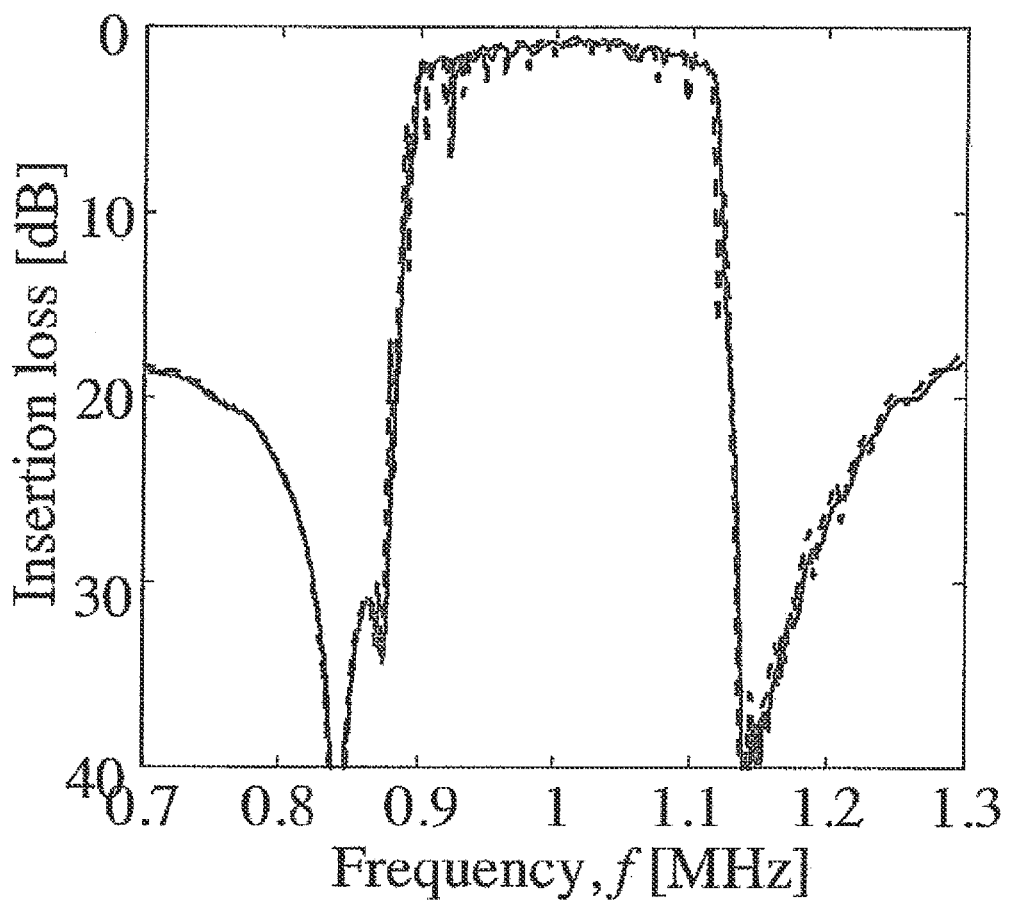
FIG. 4 Illustrates a passband for a pair of filters, published by Hashimoto, using one port resonators including responses of spurious modes.

By way of example, FIG. 3 illustrates admittance as a function of frequency for a one-port resonator including the response of a spurious mode. Such a spurious mode can significantly degrade filter response. FIG. 4 illustrates the response of a filter published by Hashimoto et. al. The notches in the passband of the filter result from the presence of the spurious mode. There is a need to overcome such spurious responses for application in commercial SAW filters.

Figures 5A, 5B:
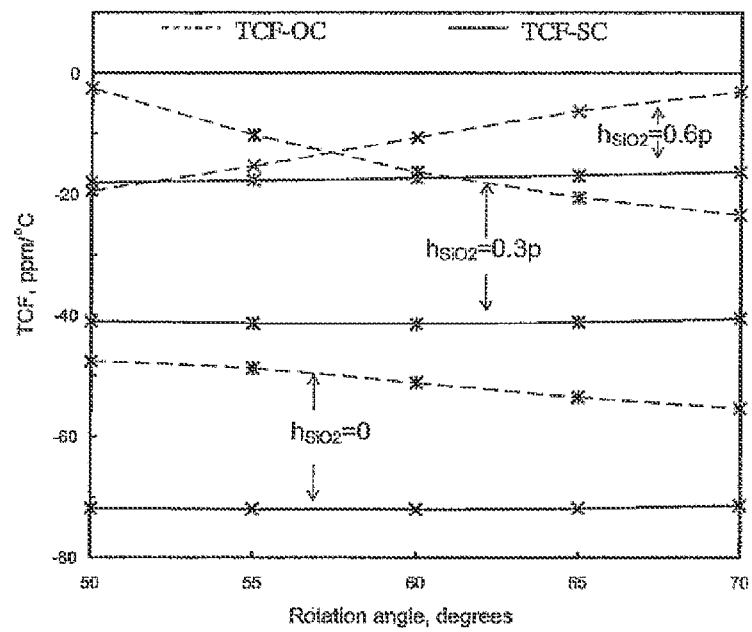
FIGS. 5a and 5b Illustrate in a plot of TCF v. Rotation Angle, and in a Table, a dependence of an estimated TCF at resonant frequency, corresponding to various thicknesses of the copper electrode and SiOx overcoat as a function of θ for Euler angles (0, θ, 0)

FIGS. 5a and 5b illustrate the TCF calculated for −40 ppm/° C. to −20 ppm/° C. rotated YX LN with Cu grating and SiOx overlay, when SiOx thickness is different. The results of FIGS. 5a and 5b are similar to those described in U.S. Pat. No. 7,339,304 to Kadota et al. (see Kadota FIG. 3), which shows TCF as function of SiO2 film thickness, in three rotated YX cuts of LN, with rotation angles 13, 30 and 70 degrees.

Figure 6:
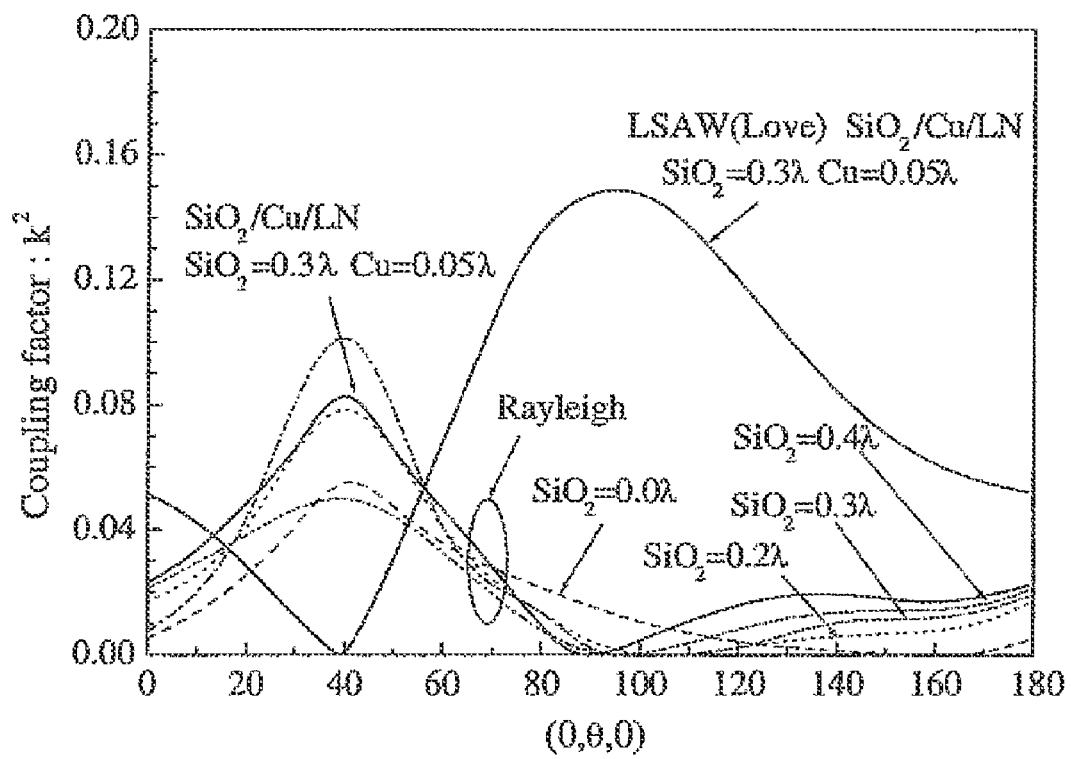
FIG. 6 illustrates an electromechanical coupling factor of Rayleigh-type SAW and LSAW on SiOx/Cu/LN or SiOx/LN as a function of θ for Euler angles (0, θ, 0)

The suppression of the spurious responses requires special attention. From the teachings of Kadota et al, it is seen that some degree of suppression may be achieved by appropriate selection and combination of electrode and SiOx thicknesses. By way of example, FIG. 6 is a reproduction a figure published by Kadota et al which illustrates this point. By combining an SiOx thickness of hox=0.60p, a copper electrode thickness of hCu=0.10p with 0YX LN it is possible to achieve a high coupling factor for the desired mode (LSAW/Love mode in Kadota's figure) while simultaneously suppressing the spurious mode (Rayleigh mode in Kadota's figure). In U.S. Pat. No. 7,339,304, Kadota illustrates the coupling of Rayleigh (spurious) mode can be minimized in rotated YX cuts of LN with Euler angles (0±5, 88±177, 0) when SiO2 thickness is 0.6p.

Other known disclosures of interest include:

U.S. Pat. No. 7,339,304 whose preferred embodiment is a SiO2 overcoat for orientations of LN. This is closely related to the present invention, but does not identify the preferred crystal orientation, nor does it recognize the value of specifying different SiOx thicknesses for different resonators;

U.S. Pat. No. 7,345,400 whose preferred embodiment relates to an SiO2 overcoat for orientation of LN. This patent respects a non-planar overcoat, and the difficulties associated with such an implementation;

U.S. Pat. No. 7,355,319 whose preferred embodiment relates to boundary acoustic waves on LN with a substantially thick SiO2 overcoat;

U.S. Pat. No. 7,411,334 whose preferred embodiment relates to a SiO2 overcoat for orientations of LT;

US Patent Application Publication 2007/284,965 whose preferred embodiment relates to boundary acoustic wave devices with a first overcoat of SiO2 having a specified thickness, followed by one or more subsequent overcoats of different composition than the first overcoat; and US Patent Application Publication 2008/160,178 where similar physical embodiment as in U.S. Pat. No. 7,339,304, whose preferred embodiment includes a final SiN overcoat to provide for efficient trimming and provides a moisture barrier.

The teachings of the present invention are herein illustrated applying an analysis using FEM/BEM to calculate the behavior of the desired and spurious modes on YX originations of LN. In particular, the dependence of each mode's coupling and velocity has been estimated.

FIGS. 7, 8, 9, 10 and 11 illustrate the dependence of the coupling factors of the desired mode and spurious mode for Euler angles of (0, θ, 0), where θ varies from 0 to 180 degrees. The coupling factors are determined from the theoretical resonance and anti-resonant velocities, $v_R$ and $v_A$, for a device of infinite aperture and length.

$$K^2=(0.5\cdot\pi\cdot v_R/v_A)/\tan(0.5\cdot\pi\cdot v_R/v_A) \quad (1)$$

When more than one mode is present, anti-resonant velocities of each mode depend upon the coupling strength of the other modes which are present. This produces an implied dependence of one mode's coupling on the other modes. So as to remove this dependence the admittance may be expressed as $$Y(f)=j\cdot w\cdot C\cdot(\Sigma R_n/(f-f_{R,n})) \quad (2)$$

$$f_A=f_R+R_n \quad (3)$$

$$v_R=f_R/(2\cdot p) \quad (4)$$

$$v_A=f_A/(2\cdot p) \quad (5)$$

Thus anti-resonant frequencies and velocities, equations (3) and (5), become effective representations, of what would be expected if the individual modes existed in the absence of the other modes.

Figure 7:
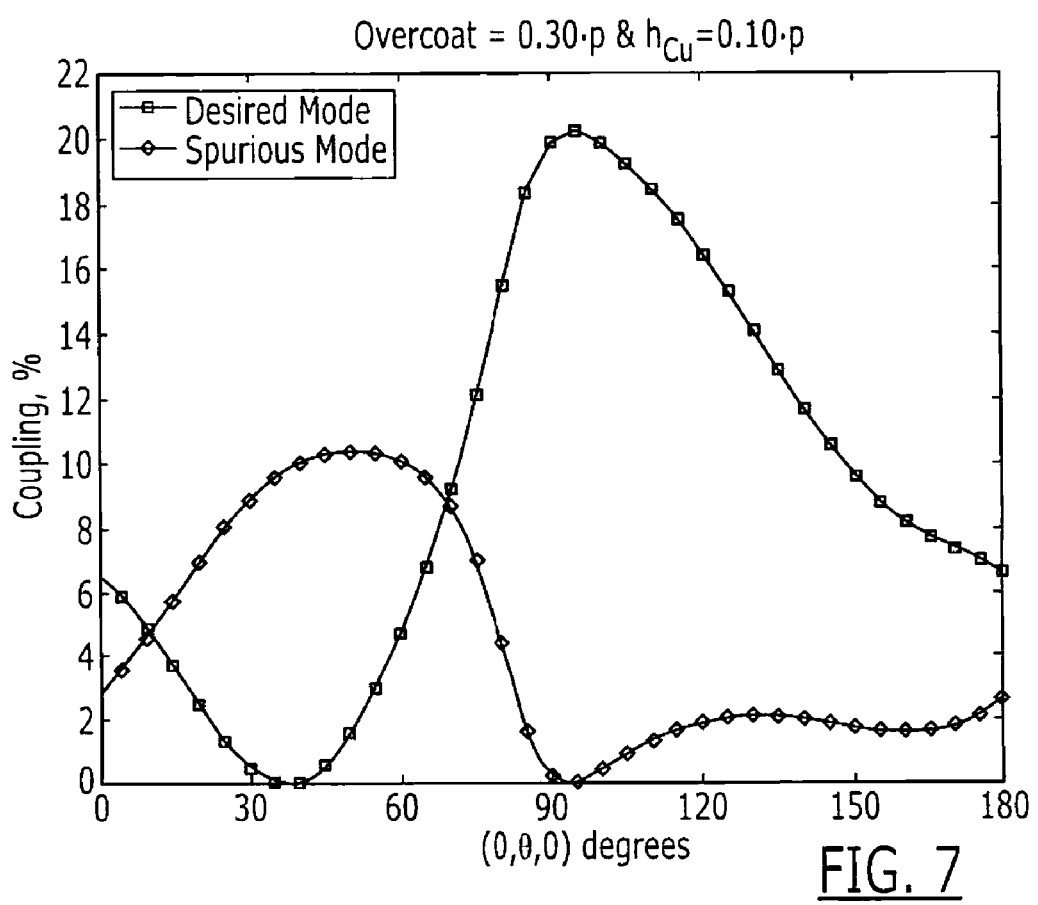
FIG. 7 Illustrates the coupling factor for a desired 'non-leaky' mode and the spurious mode for hox=0.30p and hCu=0.10p.
Figure 8:
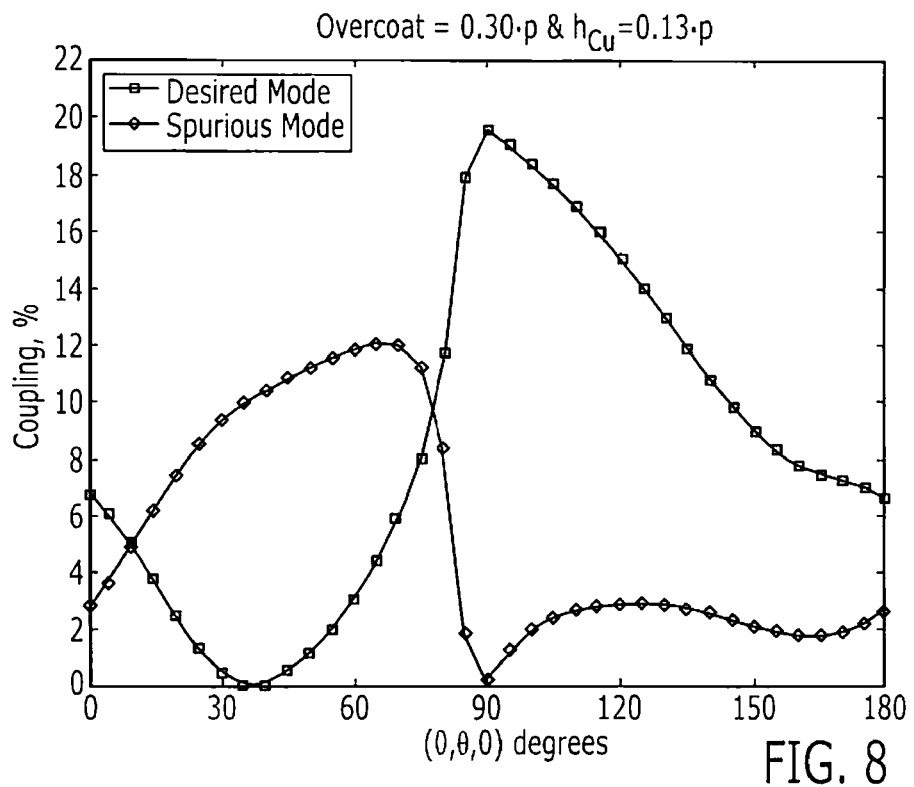
FIG. 8 Illustrates the coupling factor for a desired 'non-leaky' mode and the spurious mode for hox=0.30p and hCu=0.13p.
Figure 9:
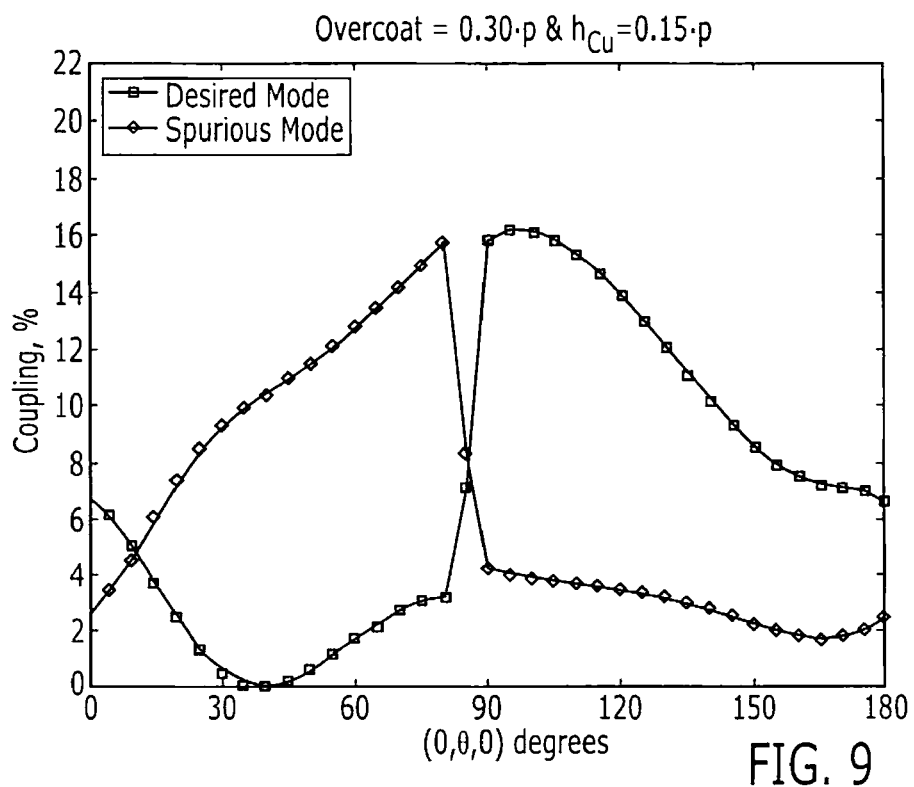
FIG. 9 Illustrates the coupling factor for a desired mode and a spurious mode for hox=0.30p and hCu=0.15p.

FIG. 7 illustrates a response for an electrode with the same thickness and composition as is illustrated by the curves in FIG. 6. However, the silicon oxide layer (SiOx) thickness respective of FIG. 7 is half that of FIG. 6, by way of example.

FIGS. 12, 13, 14, 15 and 16 illustrate the dependence of several acoustic velocities on the YX rotation. Included among there are the resonant and anti-resonant velocities of the 'non-leaky' wave, the resonant and anti-resonant velocities of the 'Rayleigh-type' SAW, and the velocity of the slow shear bulk wave (which is labeled as the cut off for BAW radiation).

FIG. 7 is seen to be very similar to the corresponding curves in FIG. 6 (by Kadota et al). There exists a narrow range of angles in the vicinity of θ=90 where the spurious ('Rayleigh') mode's coupling factor is nearly zero. In this area the response of the spurious modes is expected to be suppressed. Examination of FIGS. 8-11 illustrate that the suppression of the spurious mode is sensitive to the thickness of the copper electrode.

Further examination of FIGS. 12-16 indicates that this sensitivity may be a manifestation of interaction between the 'non-leaky' and 'Rayleigh-type' modes. That these modes are interacting is indicated by the rapid dispersion of their anti-resonant velocities as their resonant frequencies come into proximity to each other. This effect is most clear in FIG. 14 and just below θ=90 degrees.

Once this interaction begins it becomes difficult to distinguish between which mode is 'non-leaky' and which is the Rayleigh-type'. This is because there resulting modes are a combination of the two. For this reason, these modes will be qualitatively referred to as the "desired" mode and the "spurious" mode. These terms are not intended to convey the physical nature modes or their underlying wave structure, but rather to indicate their relative value in application to filter design.

Figure 10:
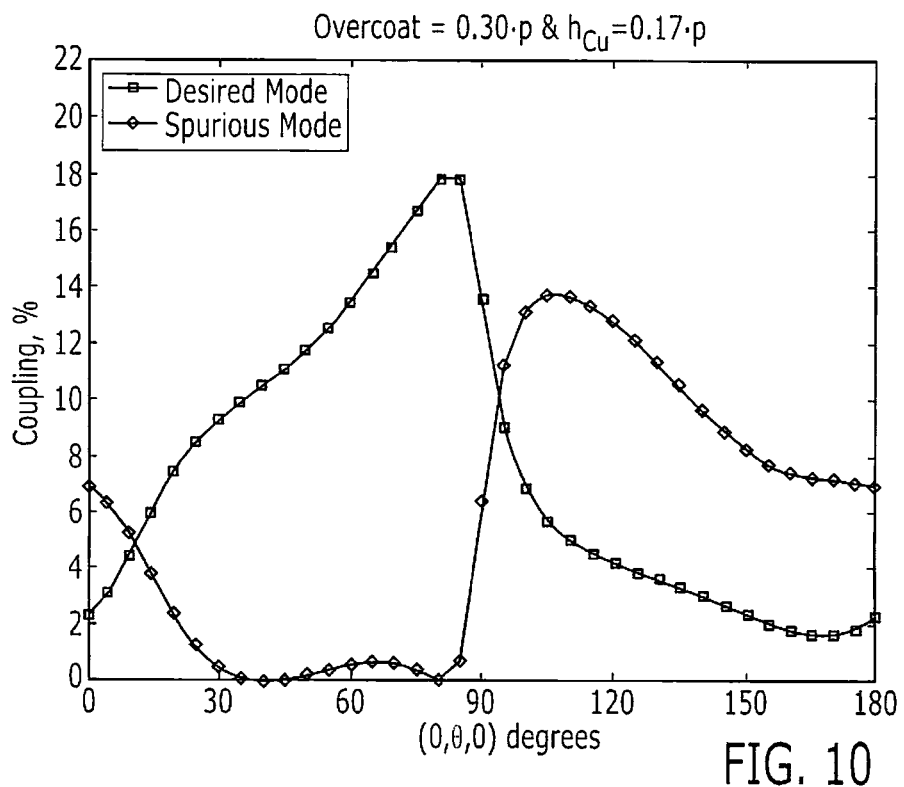
FIG. 10 Illustrates the coupling factor for a desired mode and a spurious mode for hox=0.30p and hCu=0.17p.
Figure 11:
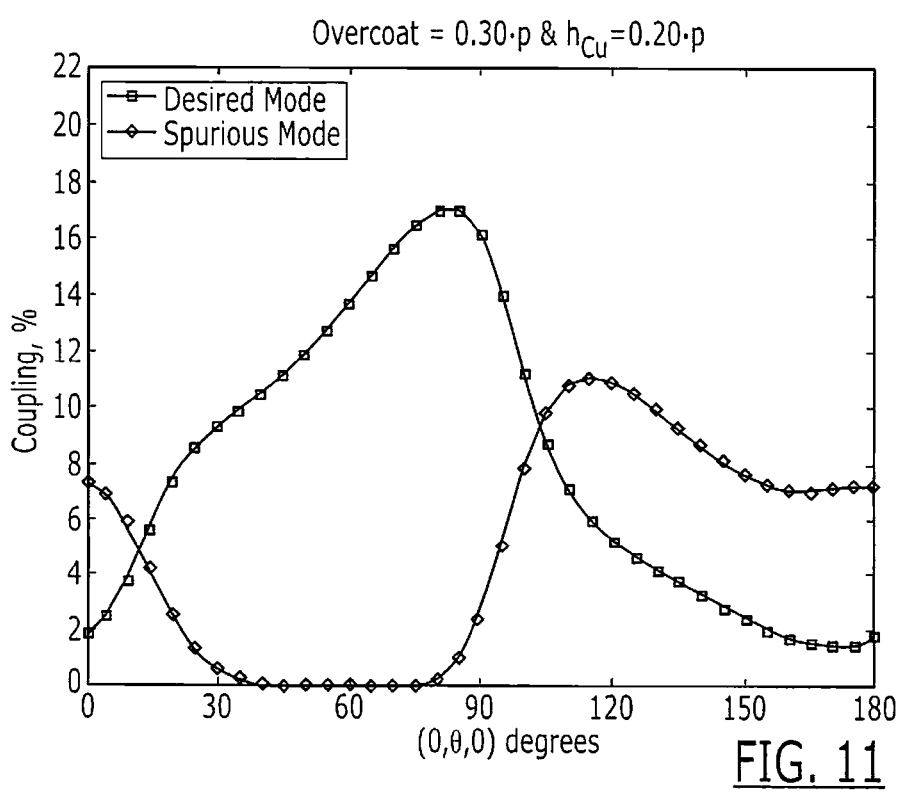
FIG. 11 Illustrates the coupling factor for a desired mode and a spurious mode for hox=0.30p and hCu=0.20p.
Figure 12:
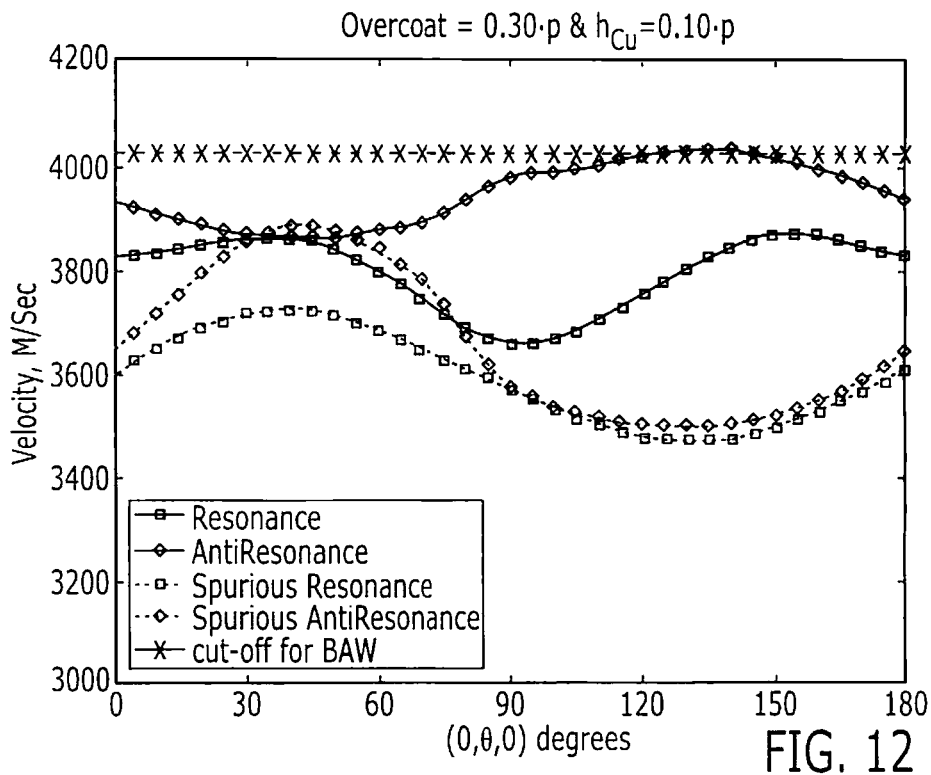
FIG. 12 Illustrates acoustic wave velocities at resonance and anti-resonance for a desired mode and a spurious mode for hox=0.30p and hCu=0.10p, the cut off velocity for radiation into the bulk of the LN is also indicated.
Figure 13:
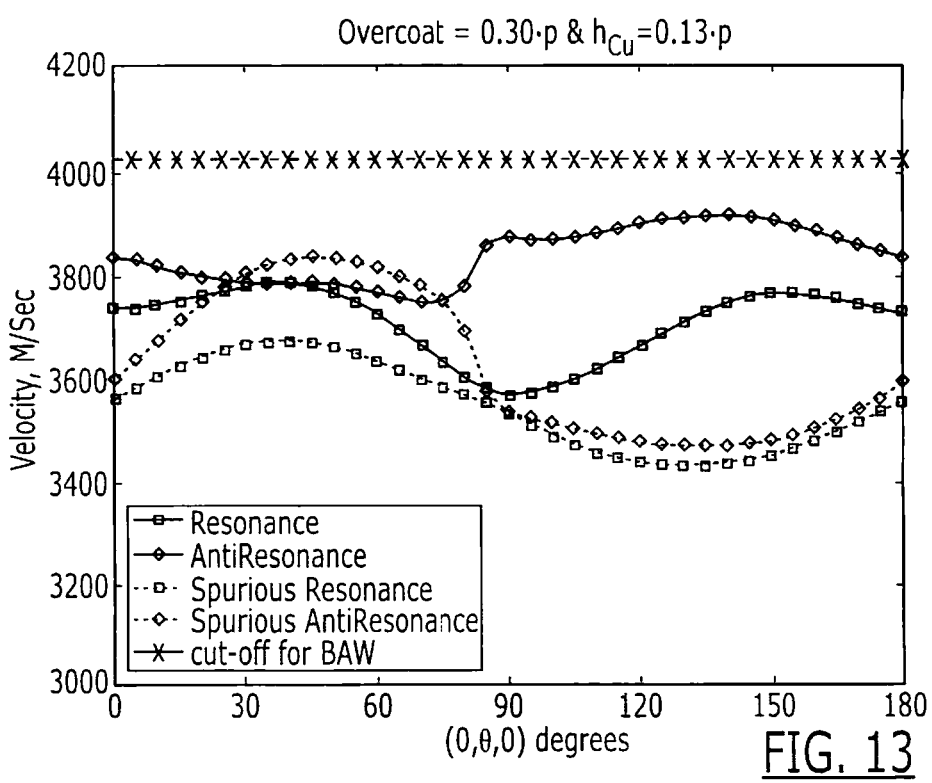
FIG. 13 Illustrates acoustic wave velocities at resonance and anti-resonance for the desired and the spurious mode for hox=0.30p and hCu=0.13p, the cut off velocity for radiation into the bulk of the LN is also indicated.
Figure 14:
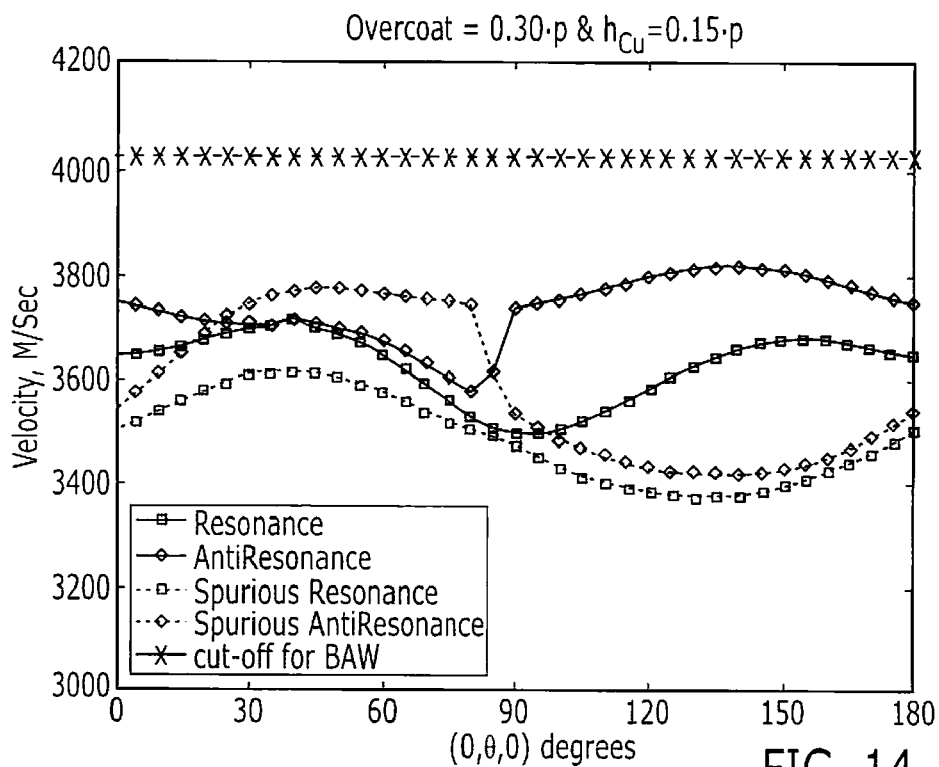
FIG. 14 Illustrates acoustic wave velocities at resonance and anti-resonance for the desired mode and the spurious mode for hox=0.30p and hCu=0.15p, the cut off velocity for radiation into the bulk of the LN is also indicated.
Figure 15:
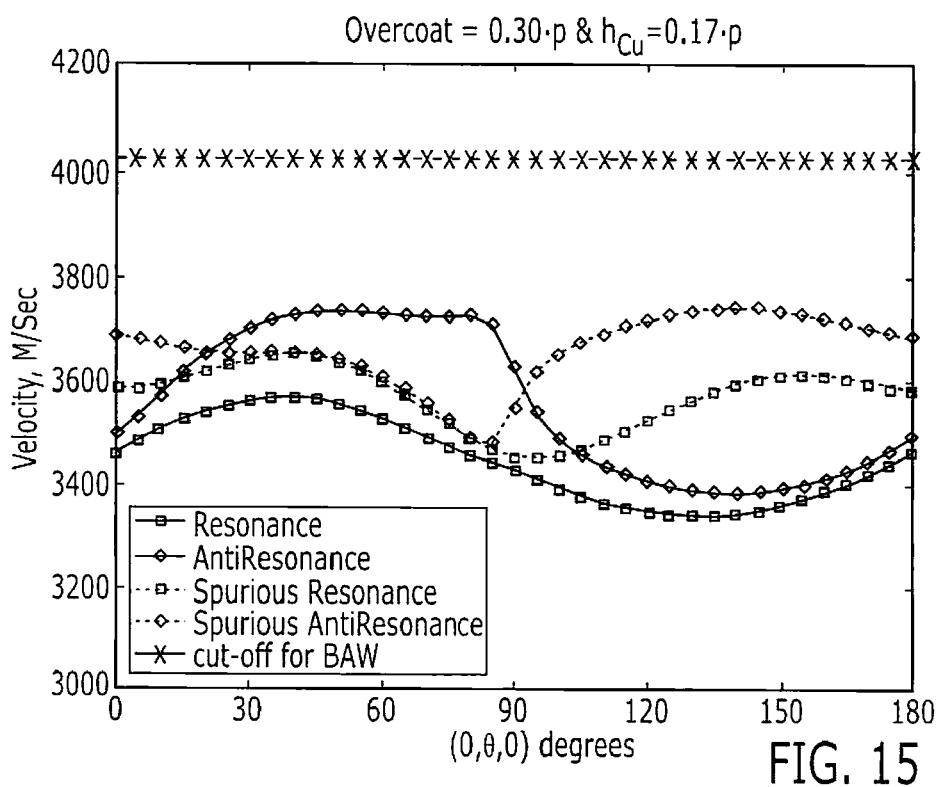
FIG. 15 Illustrates acoustic wave velocities at resonance and anti-resonance for the desired mode and the spurious mode for hox=0.30p and hCu=0.17p, the cut off velocity for radiation into the bulk of the LN is also indicated.

In FIGS. 10 and 11, it is seen that the spurious mode suppression improved in the vicinity of θ=60 degrees as the copper electrode becomes thicker. In FIG. 11, it is seen that a significant suppression of the Rayleigh modes results in the vicinity of θ=60. This orientation corresponds to −30 degree YX LN.

Figure 16:
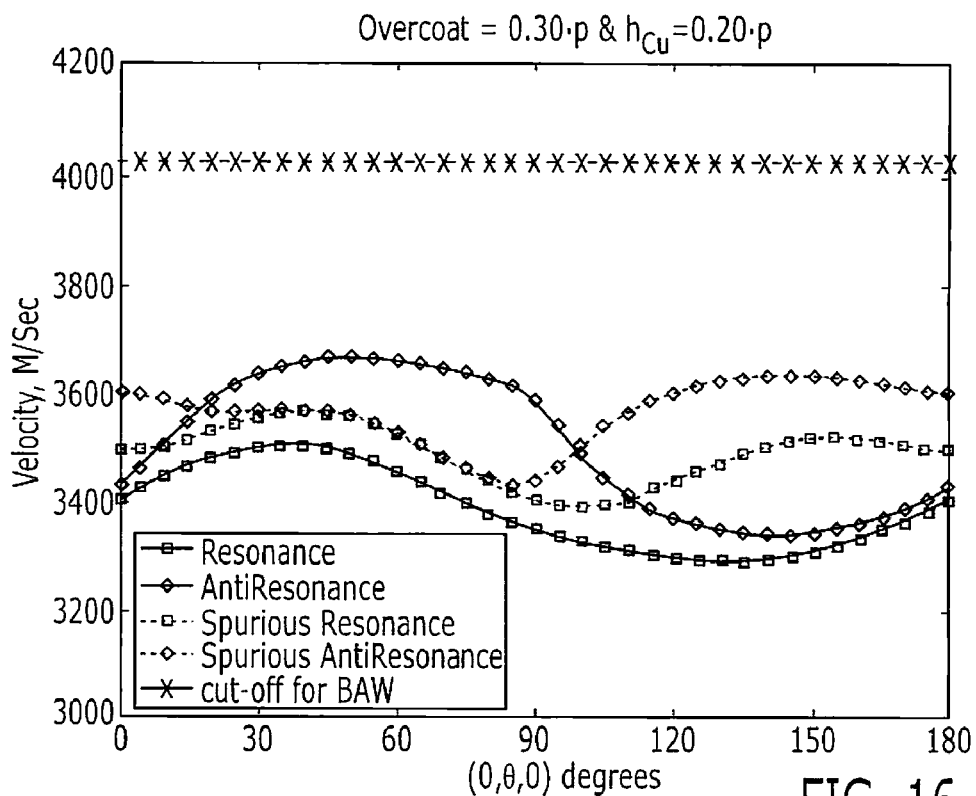
FIG. 16 Illustrates acoustic wave velocities at resonance and anti-resonance for the desired mode and the spurious mode for hox=0.30p and hCu=0.20p, the cut off velocity for radiation into the bulk of the LN is also indicated.

In FIG. 16, it is seen that the undesired spurious mode exists in the region between the resonance and anti-resonance of the desired mode. Such spurious mode may be expected to propagate in the stop band of the desired mode's response. Devices with the characteristic have not been studied as thoroughly as devices wherein the loading of the surface is insufficient to the interaction which was mentioned previously, and associated with FIG. 14.

Figure 17:
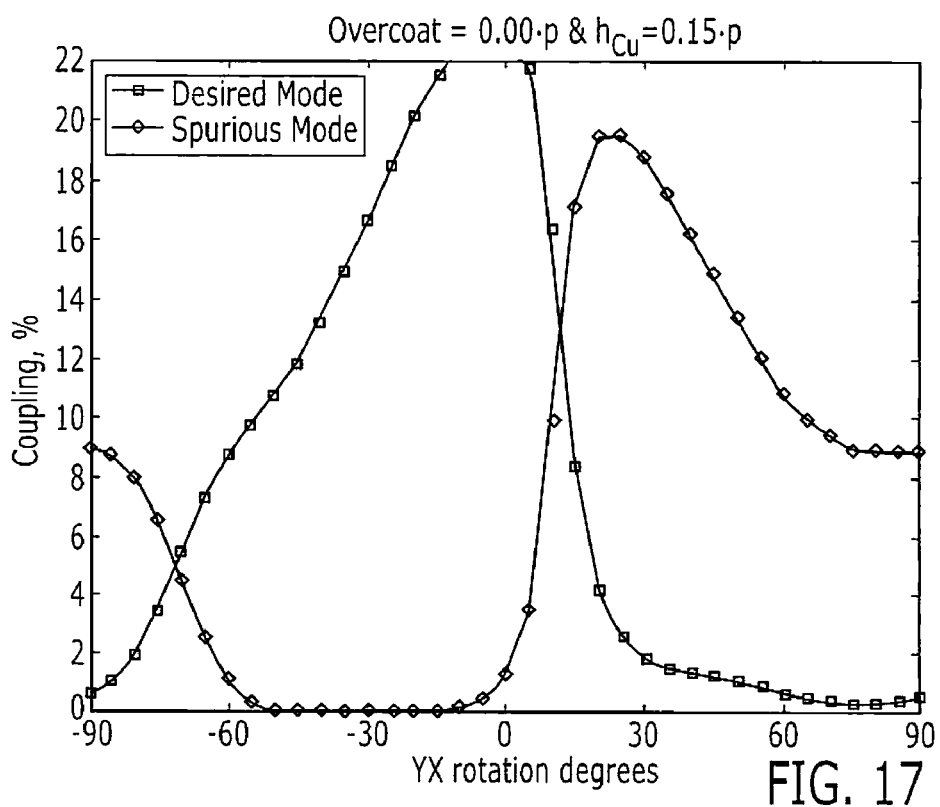
FIG. 17 Illustrates coupling factor for a desired mode and a spurious mode for hox=0.00p and hCu=0.15p, and as in FIG. 10, the spurious mode is substantially suppressed in the vicinity of θ=60 degrees.

FIG. 17 illustrates a similar behavior as seen in FIG. 11 for a copper electrode thickness of 0.15p. In the instance of hCu=0.15p, a silicon oxide (SiOx)) overcoat thickness of hox=0.00p is required to provide for a substantial suppression of the spurious mode. It is desirable that the orientation of the LN wafer remains –30 degree YX LN; Euler angles remain (0, 60, 0) degrees.

This indicates that a family of preferred embodiments exists where the suppression of the spurious mode may be achieved on a single orientation of LN. By applying the FEM/BEM method to thicknesses of copper electrodes and SiOx overcoat thicknesses ranging from 0.10p to 0.30p and 0.00p to 0.75p respectively the desirable combinations of electrode and SiOx overcoat thicknesses have been identified.

Figure 18:
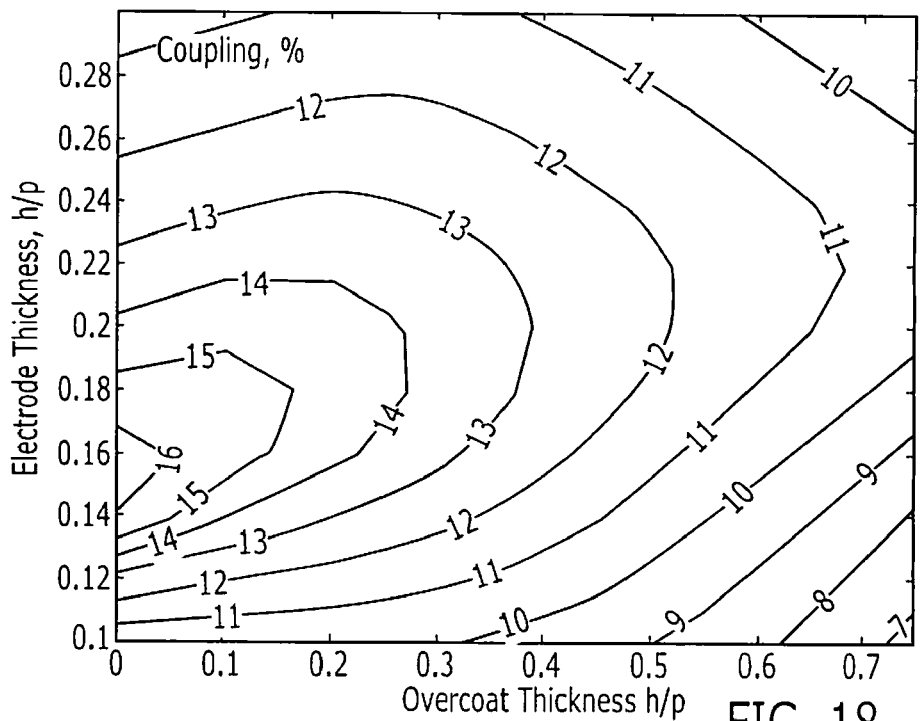
FIG. 18 Illustrates a contour for the coupling factor for a desired mode as a function copper electrode thickness and as a function of the thickness of the SiOx overcoat, the coupling factor represented as a percentage.
Figure 19:
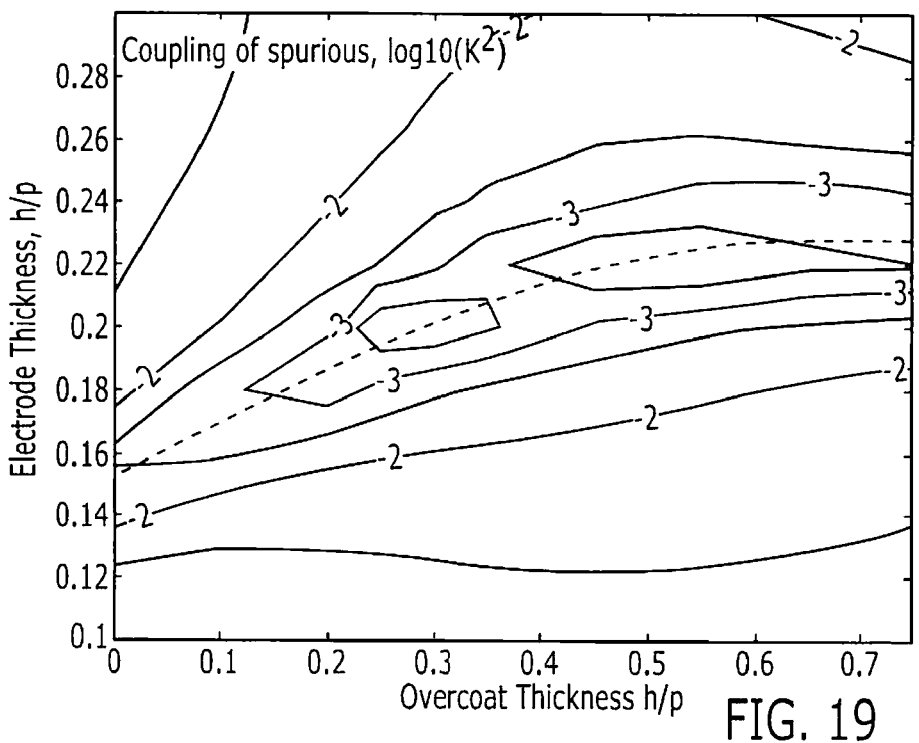
FIG. 19 Illustrates a contour for the coupling factor for the spurious mode as a function copper electrode thickness and as a function of the thickness of the SiOx overcoat, the magnitude of the coupling factor represented in logarithm base 10, the dashed line indicating the combination of specified SiOx overcoat and copper electrode thickness which produces the greatest suppression of the spurious modes' coupling factor.

FIGS. 18 and 19 illustrate the resulting estimation for the dependency of the coupling factors on the copper electrode and the SiOx thicknesses. In FIG. 19 the specified SiOx and copper electrode thicknesses which deliver the greatest suppression of the spurious mode are along the dashed curve. For significant spurious suppression, a SAW interdigital transducer (IDT) having an electrode pattern made of Cu material with a thickness of 0.2p will require to be buried in a silicon oxide layer of approximately 0.3p where p represents the period of the interdigital transducer electrode. The dashed line if FIG. 18 can be approximated by an equation as follows:

$$Hox/p=0.3(hCu-0.15)/(0.2-0.15)+/-0.05.$$

Figure 20:
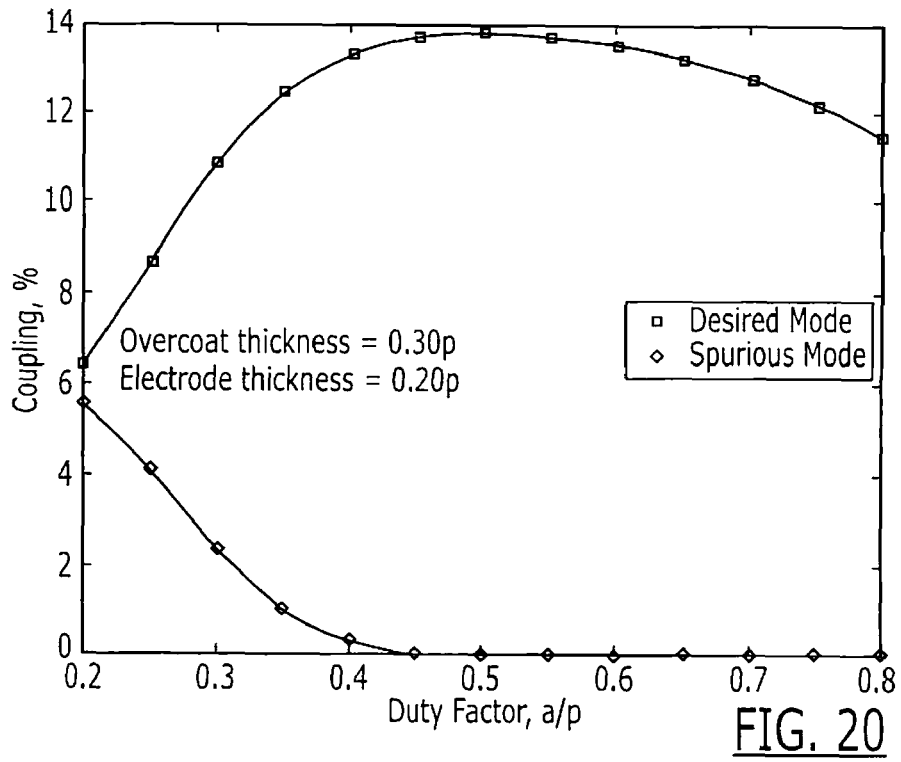
FIG. 20 Illustrates sensitivity of the coupling factors to the duty factor (a/p) for both desired and spurious modes.
Figure 21:
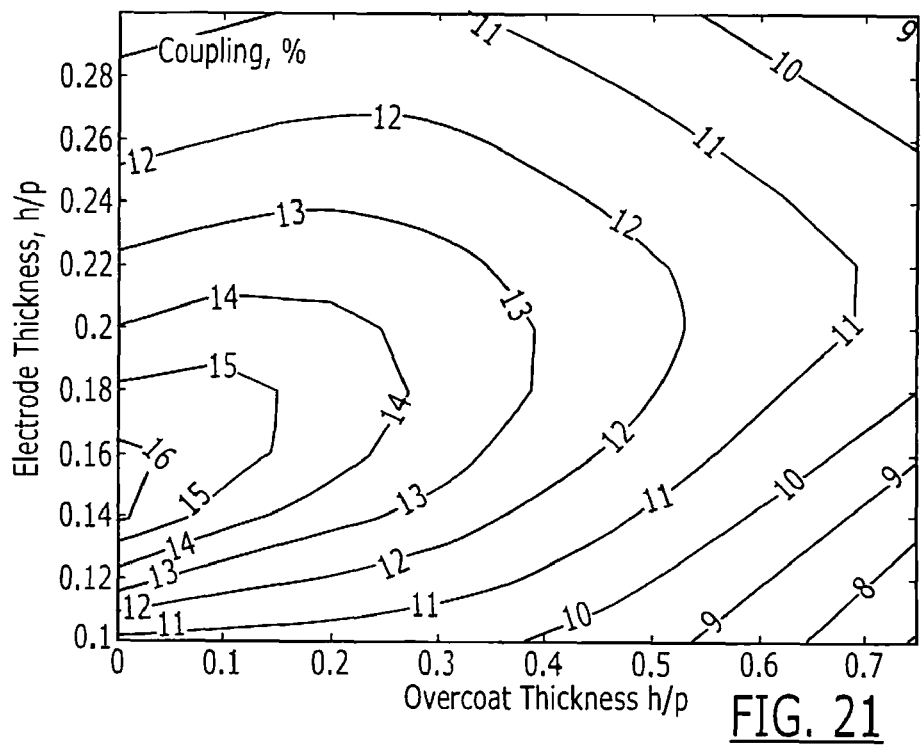
FIG. 21 Illustrates a contour for the coupling factor for the desired mode as a function copper electrode thickness and as a function of the thickness of the SiOx overcoat, for a duty factor of a/p=0.55, the coupling factor represented as a percentage.

Regarding sensitivity to device geometry, the variation in the width of the electrode is also a concern. FIG. 20 illustrates the sensitivity of the coupling factors to the electrode width. The coupling factor for the spurious mode remains substantially suppressed for duty factors (a/p) greater than 0.5. The coupling factor for the desired mode also remains strong for duty factors greater than 0.5.

To illustrate how the dependence of electrode and SiOx overcoat thickness varies with duty factor, coupling factor contours for the desired and spurious modes have been calculated for duty factors of 0.55 and 0.60. These contours are illustrated in FIGS. 21, 22, 23 and 24.

Figure 22:
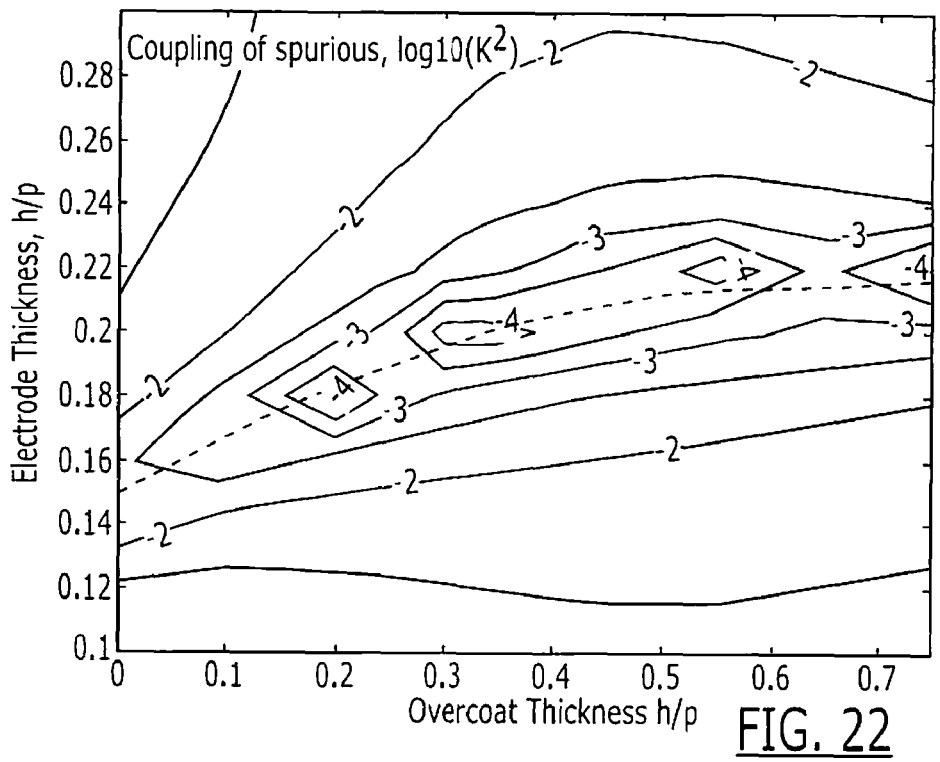
FIG. 22 Illustrates a contour for the coupling factor for the spurious mode as a function copper electrode thickness and as a function of the thickness of the SiOx overcoat, for a duty factor of a/p=0.55, the magnitude of the coupling factor represented in logarithm base 10.
Figure 23:
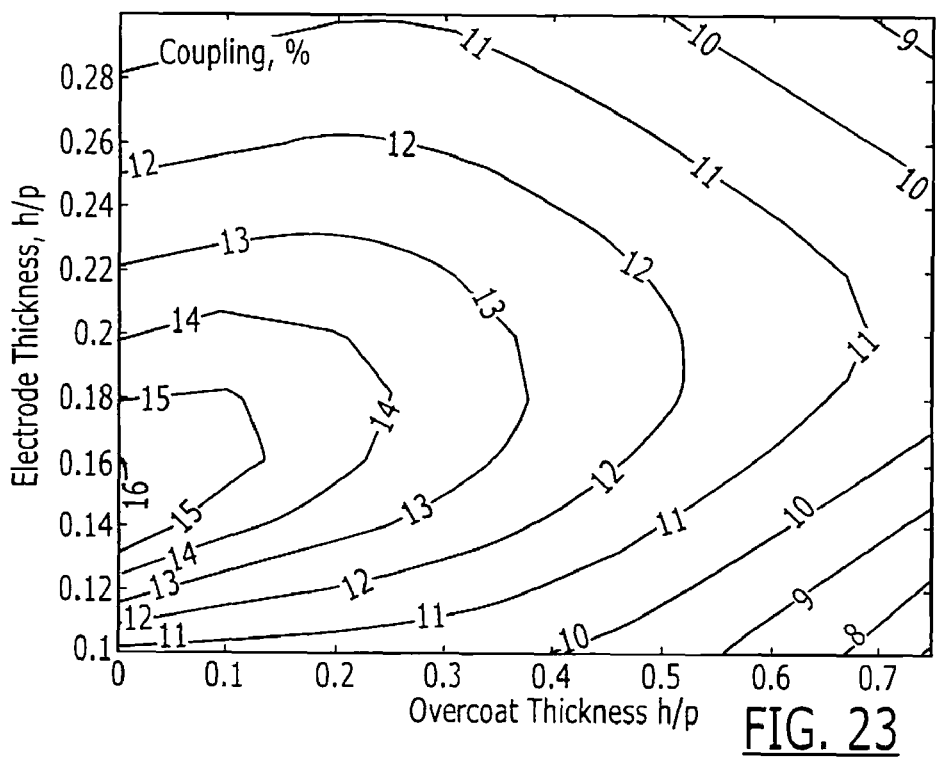
FIG. 23 Illustrates a contour for the coupling factor for the desired mode as a function copper electrode thickness and as a function of the thickness of the SiOx overcoat, for a duty factor of a/p=0.60, the coupling factor represented as a percentage.
Figure 24:
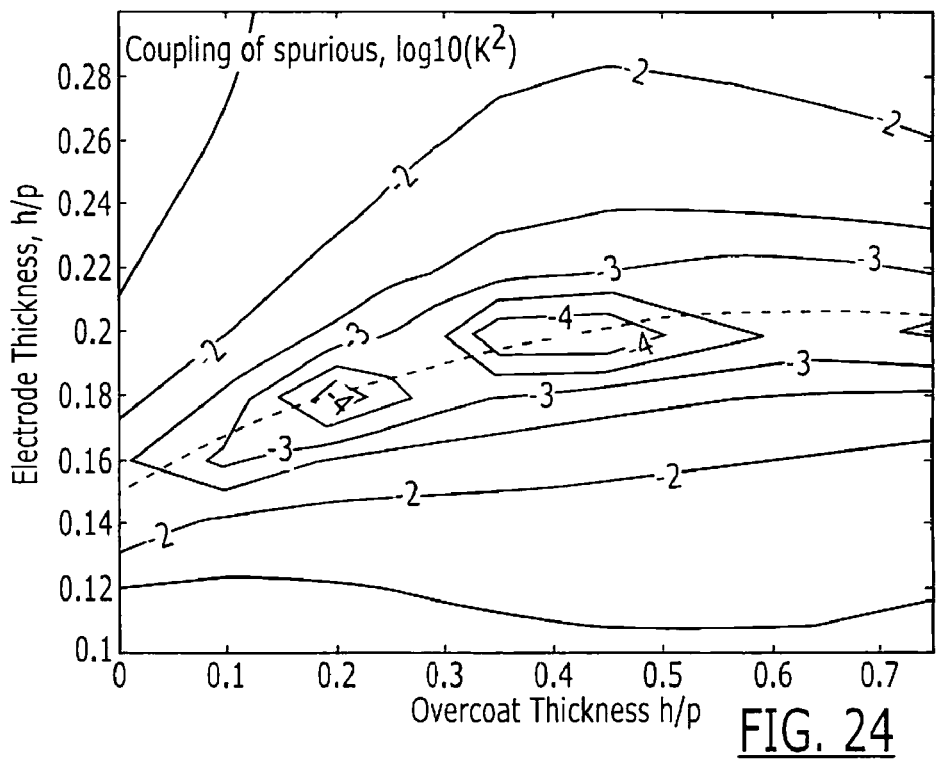
FIG. 24 Illustrates a contour for the coupling factor for the spurious mode as a function copper electrode thickness and as a function of the thickness of the SiOx overcoat, for a duty factor of a/p=0.60, the magnitude of the coupling factor represented as the logarithm base 10.
Figure 25:
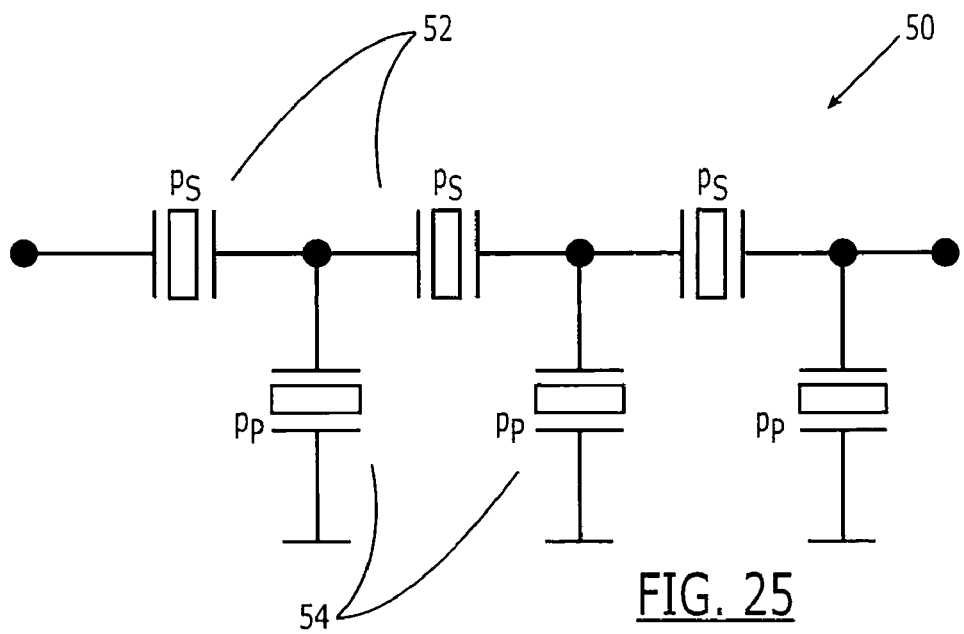
FIG. 25 schematically illustrates an impedance element filter composed of one port SAW resonators, the electrode pitch of the series resonators is $p_s$ and the pitch of the parallel resonators is $p_P$.

A close examination of FIGS. 19, 22, and 24 demonstrates that the spurious mode coupling factor is significantly more sensitive to the thickness of the electrode than to the thickness of the SiOx overcoat. This presents a significant problem. By way of example, consider the diagrammatical illustration of the schematic of the impedance element filter 50 in FIG. 25. The series elements 52 and parallel elements 54 have periods, $p_s$ and $p_R$ respectively. The relative difference between the periods of the resonators is approximately half the coupling factor of the desired mode. In this example, the coupling factor is between 10% and 16%, indicating that a filter design will require resonators whose electrode periods differ by at least 5% to 8%.

Since the electrode thickness for any particular filter is nominally constant for each resonator in that filter, the relative electrode thickness (h/p) varies to the same degree as does the electrode period (i.e. h is constant). Examining FIG. 18 with this perspective in mind, it becomes clear that maintaining suppression of the spurious mode is a significant challenge for filters with large coupling factors.

Figure 28:
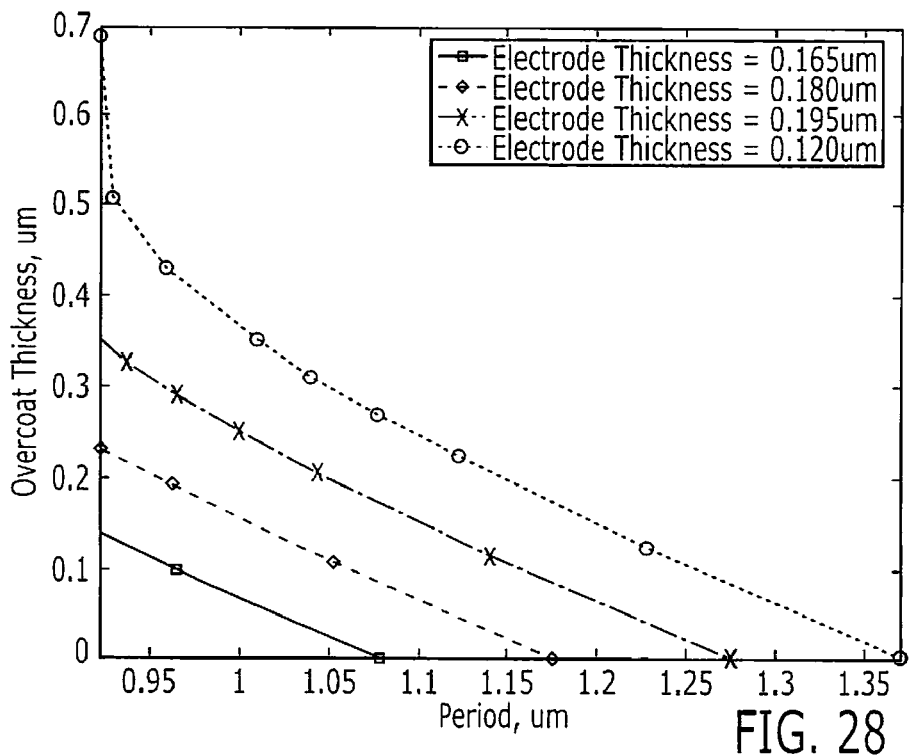
FIG. 28 Illustrates a trend in how an SiOx overcoat thickness would vary with a period of a resonator's copper electrode period for specific thicknesses of the electrode, the curves represent a different perspective of the relationship indicated by the dashed curved line in FIG. 18.

One substantial problem to be solved is how to construct a filter with resonators of different pitches, while maintaining suppression of the spurious modes for each of the resonators. By adjusting the thickness of the SiOx overcoat in a specified way, the suppression of the spurious mode may be maintained. By way of example, reference is made to FIG. 19 illustrating if a difference in the nominal period of a pair resonators produces relative electrode thicknesses of 0.20p and 0.22p, then the desired thickness of the SiOx overcoat for each of these resonators would be 0.30p and 0.45p. This indicates that if the thickness of the electrode is constant, as the electrode pitch decreases the thickness of the dielectric overcoat must be increased in order to maintain suppression of the spurious mode's coupling factor. This relationship is illustrated in FIG. 28, and is derived from the dashed curve in FIG. 19.

This is an unexpected result. For example, it would appear to be reasonable to expect the relative overcoat thickness, hox/p, to remain constant as the period, p, is varied. Although one might expect, or desire, the absolute overcoat to remain constant as the period, p, is varied it is quite unexpected and non-obvious that the absolute overcoat thickness should vary inversely with the electrode period. This inverse dependence is substantial.

As initially described with reference to FIG. 1, one embodiment of the invention comprises the SAW device 10 having a geometry where two or more resonators 14, 16 may exist with two or more periods 28, 34. Examining FIG. 19, and for the copper electrodes 36, 38, it may be concluded that physical geometries in FIG. 1 must satisfy the condition in equation (6).

$$(h_{OX1}/p_1-h_{OX2}/p_2)/(h_{Cu}/p_1-h_{Cu}/p_2)>5 \qquad (6)$$

Figure 26:
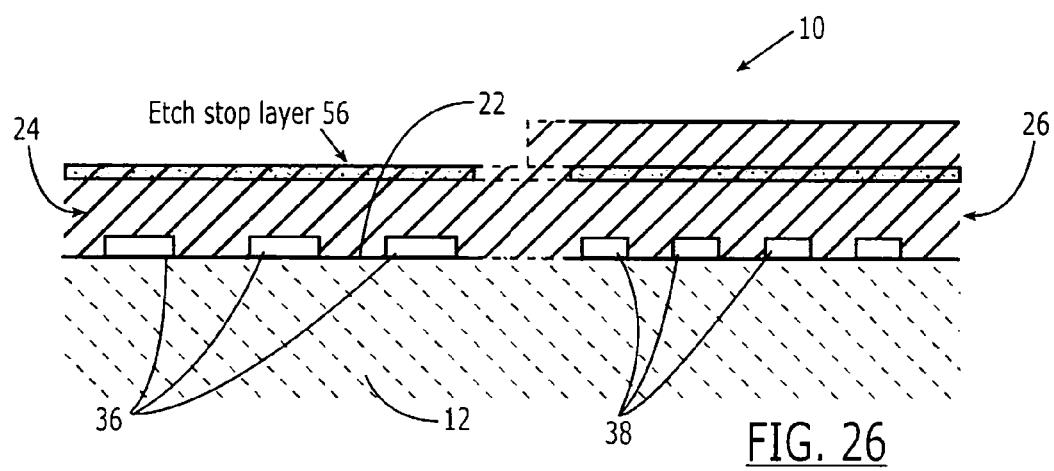
FIG. 26 Illustrates a SAW device with two or more resonators and two or more electrode periods with the oxide overcoat adjusted to a specified thicknesses as required to suppress the coupling factor for the spurious modes for each resonator, the specified change in oxide thickness is facilitated using an etch stop by way of example.

By way of further example, to obtain such a change in the SiOx overcoat thickness as indicated in FIG. 1, a specific process step is applied during the manufacture of the device 10. The entire device 10 may first be fabricated with the thickness SiOx overcoat required by the individual resonators. The SiOx overcoat may then be patterned and etched using standard thin file methods to reduce the thickness of the SiOx overcoat for the other resonators. To facilitate this process an etch stop layer 56 may be applied as illustrated in FIG. 26. The device 10 of FIG. 1 may be achieved by appropriate patterning and control of the etching of the SiOx to achieve the desired difference in SiOx thicknesses for the resonators 14, 16 within the desired device 10. In contrast, for the embodiment of FIG. 26, the control over SiOx thickness may be determined by a deposition process. While the process steps to achieve the embodiment in FIG. 26 are more numerous, the control over the resulting difference in the SiOx overcoat thickness may be improved.

The presence of the spurious mode within the stop band of the desired mode presents the possibility that the spurious mode may manifest transverse modes that result in several additional resonances in the response of the desired mode.

Adjusting the SiOx overcoat thickness to match specified changes in electrode thicknesses is limited to specific geometries, as indicated by the dashed line in FIG. 19 for copper electrodes and an SiOx overcoat.

In the event that the electrode is constructed by metals other than copper, a different relationship between the electrode thickness and SiOx overcoat thickness will likely be desired. However, the same general principle for suppression of the spurious mode's coupling factor may be applied. Thus, it is also desirable that the same method be applied to devices with different electrode compositions.

Likewise, the dielectric overcoat may include layers of materials other than SiOx. These materials may be intended to be used as an etch stop, for frequency adjustment, or for some other purpose. Thus, it is also desirable that the method described includes dielectric layers above the electrode that are not composed of SiOx. In such an instance, what is desirable is that the material composition and thickness above the individual resonators is adjusted so as to maintain suppression of the spurious mode's coupling factor as the pitch of the individual resonators is changed.

Figure 27:
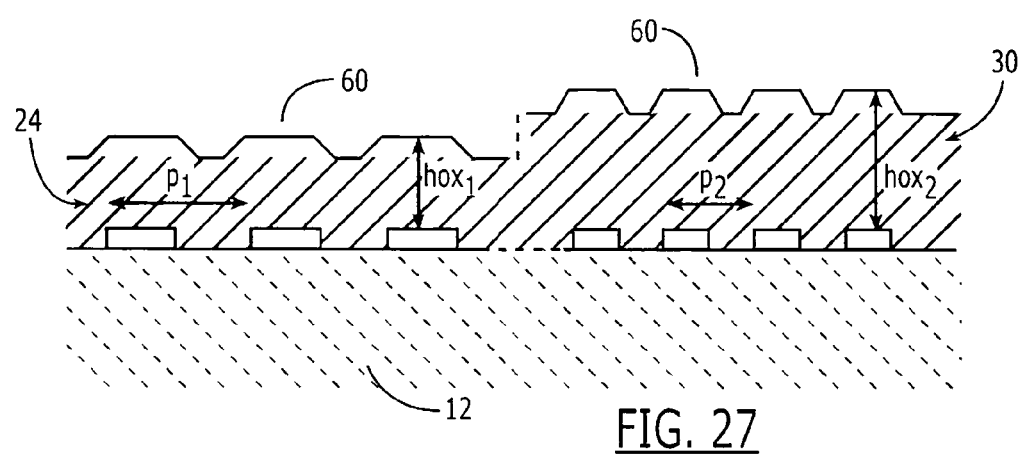
FIG. 27 Illustrates an oxide overcoat that is non-planar, and has been varied in thickness to maintain suppression of spurious mode for resonators with a different nominal pitch.

By way of further example and with reference now to FIG. 27, the dielectric overcoat 24, 30 need not be substantially planar, as illustrated with reference to the overcoat surface 58 illustrated with reference again to FIG. 1, and may have a stepped styled surface 60 as illustrated with reference to FIG. 27 to apply a modulation of the overcoat thickness in order to maintain suppression of the spurious mode's coupling factor.

For embodiments of the present invention, the coupling factor of the desired mode should be strong while suppressing the coupling factor for the spurious and while providing for improved TCF as compared to the prior art.

Figure 29:
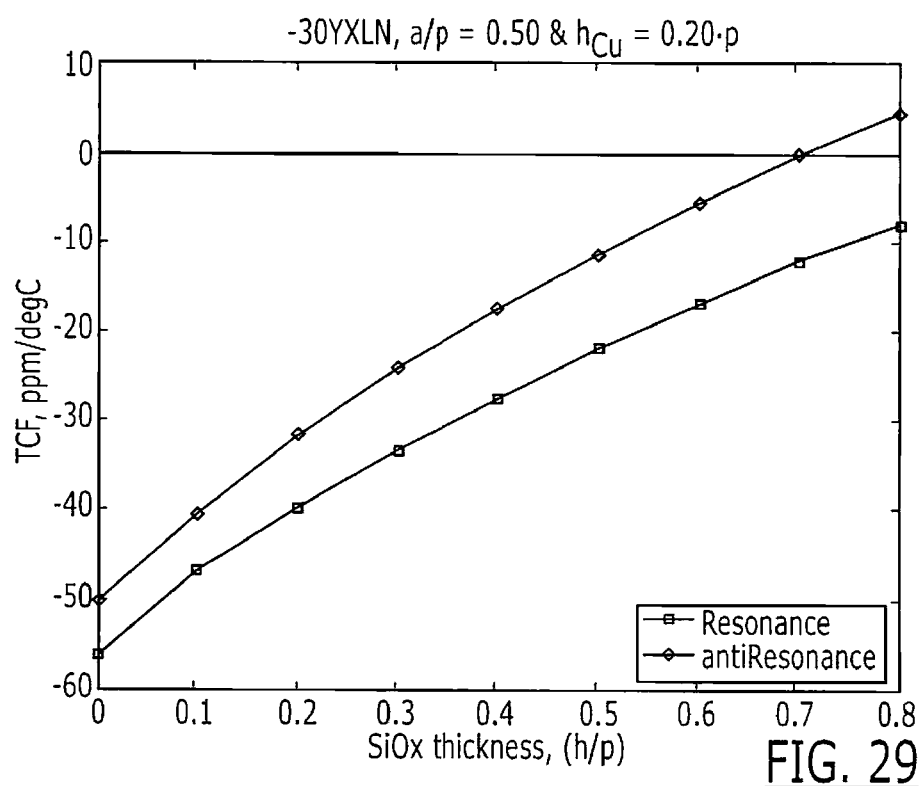
FIG. 29 Illustrates a dependence of a desired mode's resonant and anti-resonant TCF on the SiOx overcoat thickness for a copper electrode thickness of 0.20p and a duty factor of a/p=0.5.

Examination of FIGS. 18 and 19 indicates that a wide range of desired mode coupling factors are consistent with suppression of the spurious mode. FIG. 29 illustrates how the TCF for a resonator depends upon the SiOx overcoat thickness. Thus, these physical embodiments provide for devices with desired mode coupling factors from about 16% to about 10% while simultaneously providing for TCFs at resonance/anti-resonance of about −57/−50 to +5/−8 ppm/° C.

Unlike the prior art, the coupling factors and TCFs for individual resonators comprising one SAW device, an embodiment according to the teachings of the present invention is comprised of resonators with varied coupling factors and TCFs.

Depending upon the performance specifications of the SAW device, a trade-off between coupling factor and TCF may be made.

To illustrate the value of these embodiments, heavy copper electrodes with a planar SiOx overcoat have been used. However, the composition of the electrodes need not be copper. Any heavy metal or conductive material consistent with the teachings of the invention may be used, and are intended to be covered. Non-planar SiOx overcoats are also intended to be included in embodiments of the invention. The overcoats may also include additional dielectric layers or their surface etched to provide for grooves, dots, voids, or other geometries and remain consistent with the disclosed preferred embodiments.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. A surface acoustic wave device comprising:
a single crystal LiNbO3 piezoelectric substrate for providing a propagation of a leaky acoustic wave, the substrate having an electromechanical coupling factor exceeding 5%, and an orientation defined by Euler angles (0±3°,θ, 0±3°), with angle θ=90−θ', where θ' is a YX rotation angle of the substrate that ranges from about −40° to about −20°;
an electrode pattern formed from electrodes provided on a surface of the piezoelectric substrate, the electrode pattern forming at least one resonator and the electrodes primarily formed from copper, wherein a thickness of the copper electrode pattern ranges from 0.15p to 0.25p, and wherein "p" being a period of the electrodes within the electrode pattern; and
a dielectric overcoat comprising a SiOx, the dielectric overcoat having a positive TCF, the dielectric overcoat disposed between and over the electrodes of the electrode pattern, wherein a density of the electrodes substantially exceeds a density of the dielectric overcoat, the dielectric overcoat having a thickness in the range of hox/p=0.30*(hCu−0.15)/(0.20p−0.15)+/−0.05, wherein "hox" is a thickness of the overcoat as measured above a top surface of the electrodes, and "hCu" is a thickness of the electrodes within the electrode pattern.

2. A surface acoustic wave device according to claim 1, further comprising at least two resonators, wherein the dielectric overcoat layer comprises silicon oxide, the first resonator having a first silicon oxide overcoat layer of thickness hox1 and electrode period p1, the second resonator having a second silicon oxide overcoat layer of thickness hox2 and an electrode period p2, the first and second overcoat layers defined by hox1/p1 and hox2/p2, respectively.

3. A surface acoustic wave device according to claim 1, further comprising at least two resonators, wherein the first resonator has a silicon oxide layer of thickness hox1 and electrode period p1 and wherein the second resonator has a silicon oxide layer of thickness hox2 and an electrode period p2, the two resonators having nominal periods and overcoat thicknesses satisfying the relationship (hox1/p1−hox2/p2)/(hCu/p1−hCu/p2)>5.

4. A surface acoustic wave device according to claim 1, wherein the thickness of the dielectric overcoat above the at least one resonator nominally increases as a period of the at least one resonator decreases.

5. A surface acoustic wave device according to claim 1, wherein the thickness of one dielectric overcoat is specified to be inversely related to a period of the at least one resonator.

6. A surface acoustic wave device according to claim 5, further comprising an etch stop layer, wherein the etch stop layer comprises at least one of SiN and AlN.

7. A surface acoustic wave device according to claim 1, wherein a surface of the dielectric overcoat is planar.

8. A surface acoustic wave device comprising:
a single crystal piezoelectric substrate for providing a propagation of a leaky acoustic wave, the substrate having an electromechanical coupling factor exceeding 5%; and
an electrode pattern formed from electrodes provided on a surface of the piezoelectric substrate forming at least two resonators, wherein a first resonator has a silicon oxide layer of thickness hox1 and electrode period p1 and a second resonator has a silicon oxide layer of thickness hox2 and an electrode period p2, wherein the dielectric overcoat thicknesses of the at least two resonators are specified to be inversely related to the period of the resonator electrode.

9. A surface acoustic wave device according to claim 8, wherein the thicknesses of the dielectric overcoats above the at least two resonators nominally increases as a period of the at least two resonators decreases.

10. A surface acoustic wave device according to claim 8, wherein the electrode is composed primarily of Copper.

11. A surface acoustic wave device according to claim 10, wherein the two resonators have electrode periods and overcoat thicknesses satisfying the relationship (hox1/p1−hox2/p2)/(hCu/p1−hCu/p2)>5, hCu representing a thickness of the Copper electrodes.

12. A surface acoustic wave device according to claim 8, wherein the thickness of electrodes is in a range of about 10% to about 30% of an electrode period; and the piezoelectric substrate comprises a Lithium Niobate substrate having an orientation defined by Euler angles (0±3°,θ,0±3°), with angle θ=90°−θ' and YX rotation angle θ'.

13. A surface acoustic wave device according to claim 12, wherein θ' ranges from about −40° to about −20°.

14. A surface acoustic wave device comprising:
- a single crystal piezoelectric substrate having a surface for providing propagation of acoustic waves;
- first and second resonators formed on the surface of the substrate;
- first and second electrode patterns including a plurality of electrodes forming the first and second resonators, respectively;
- a first dielectric overcoat formed over the first resonator and a second dielectric overcoat formed over the second resonator,
- wherein the first resonator includes the first dielectric overcoat having a thickness of hox1 and an electrode period p1,
- wherein the second resonator includes the second dielectric overcoat having a thickness hox2 and an electrode period p2, and
- wherein the dielectric overcoat thickness for each of the first and second resonators is inversely related to the electrode period of the resonator, thus reducing the electrode period results in an increasing of the dielectric overcoat for maintaining performance of the device, including suppressing a coupling factor for spurious modes for each resonator.

15. A surface acoustic wave device according to claim 14, wherein the dielectric overcoat comprises SiOx.

16. A surface acoustic wave device according to claim 14, wherein the substrate comprises an electromechanical coupling factor exceeding 5%.

17. A surface acoustic wave device according to claim 14, wherein each of the plurality of electrodes is composed substantially of Copper.

18. A surface acoustic wave device according to claim 17, wherein the two resonators have electrode periods and overcoat thicknesses satisfying the relationship (hox1/p1−hox2/p2)/(hCu/p1−hCu/p2)>5, hCu representing a thickness of the Copper electrodes.

19. A surface acoustic wave device according to claim 14, wherein
- the thickness of electrodes is in a range of about 10% to about 30% of an electrode period; and
- the piezoelectric substrate comprises a Lithium Niobate substrate having an orientation defined by Euler angles (0±3°,θ,0±3°), with angle θ=90°−θ' and YX rotation angle θ', where θ' ranges from about 40° to about −20°.

* * * * *